United States Patent [19]

Kosel

[11] 4,135,163

[45] Jan. 16, 1979

[54] PHASE REGULATING CIRCUIT FOR CONTROLLING SPACED PULSE SEQUENCES

[75] Inventor: Helmut Kosel, Holzkirchen, Germany

[73] Assignee: Siemens Aktiengesellschaft, Berlin & Munich, Germany

[21] Appl. No.: 847,211

[22] Filed: Oct. 31, 1977

[30] Foreign Application Priority Data

Apr. 15, 1977 [DE] Fed. Rep. of Germany ....... 2716813

[51] Int. Cl.² .............................................. H03B 3/04
[52] U.S. Cl. .................................... 331/1 A; 331/14; 331/17; 331/25
[58] Field of Search ...................... 331/1 A, 14, 17, 18, 331/25

[56] References Cited

U.S. PATENT DOCUMENTS

| | | | |
|---|---|---|---|
| 3,573,649 | 4/1971 | West | 331/17 X |
| 3,688,210 | 8/1972 | Fort et al. | 331/14 X |
| 3,882,412 | 5/1975 | Apple, Jr. | 331/1 A |

Primary Examiner—Siegfried H. Grimm
Attorney, Agent, or Firm—Hill, Gross, Simpson, Van Santen, Steadman, Chiara & Simpson

[57] ABSTRACT

A phase regulating circuit in which a phase comparator is supplied with output pulses of a pulse generator over a frequency divider and, for comparison therewith, the timing pulses derived from a displacement pick-up, with the output of the phase comparator being utilized for controlling the pulse generator to regulate the phase of the output thereof, means being provided for interrupting the supply of timing pulse from the frequency divider to the phase comparator in the event of an interruption in the displacement pick-up pulses, and which, upon recurrence of the displacement pick-up pulses, reconnects the frequency divider to the comparator for supplying divider output pulses to the comparator which have been matched in phase as close as possible to that of the displacement pick-up pulses.

8 Claims, 2 Drawing Figures

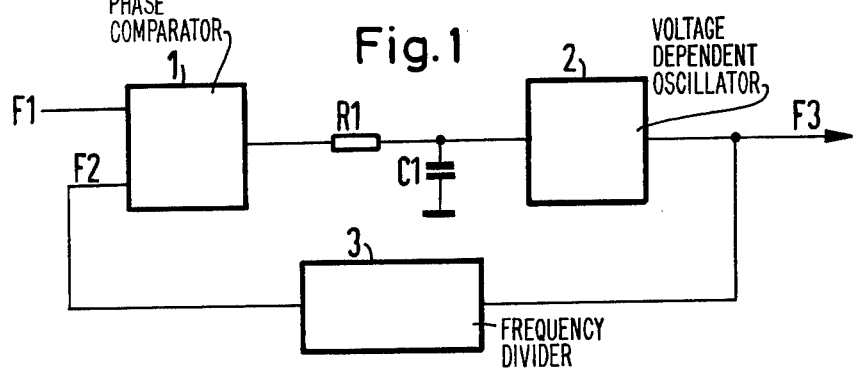
PRIOR ART
Fig.1
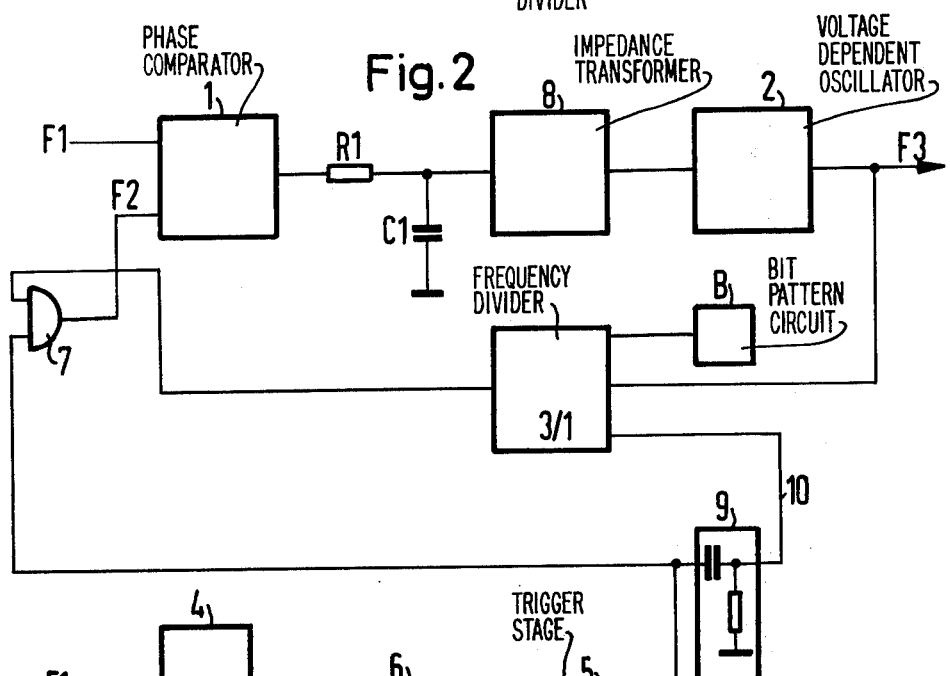
Fig.2
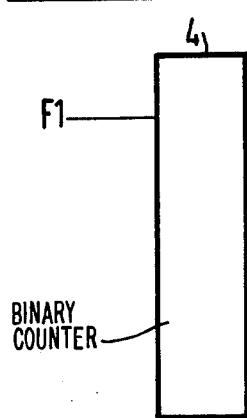

PHASE REGULATING CIRCUIT FOR CONTROLLING SPACED PULSE SEQUENCES

BACKGROUND OF THE INVENTION

The invention relates to a phase regulating circuit employing a comparator, a pulse generator and a frequency divider in conjunction with a displacement pick-up, which constantly synchronizes the phase regulating circuit.

A displacement pick-up for the production of electric timing signals, at times at which predetermined points of a path which is to be traversed are exceeded, is known from U.S. Pat. No. 4,019,186, in which a light-transmitting rod is arranged along the path to be traversed, the rod having marks at predetermined points along the path to be traversed. As the light beam moves along the light transmitting rod, it is so influenced by the respective marks that it falls upon a photo element whose output signals represent the timing signals.

If a displacement pick-up of this type is utilized, for example, with a non-mechanical printer employing a laser beam for recording upon the surface of a recording drum, a part of the actual main recording beam, with the aid of the displacement pick-up, produces the timing pulses required for effecting the recordation of a row.

As a result of the geometric dimensioning of the displacement pick-up, the timing pulses can be produced only at specified intervals and the pulse train frequency obtained therefrom, between the individual single points determined by the marks on the light transmissive rod, must be multiplied and regulated. This type of pulse train production may be effected, for example, by utilization of a phase regulating circuit such as described in U.S. Pat. No. 3,705,361.

When a phase regulating circuit of this type is employed in association with the previously described displacement pick-up, gaps are formed in the produced pulse sequences as, during the recording operation, the scanning beam which functions to scan the displacement pick-up, returns from the end of one recording operation to the beginning of the next. A pulse gap of this type can, for example, comprise 20 percent of the time of the total horizontal cycle of the scanning beam. Consequently it is necessary to suitably compensate for the breakdown of the pulse train frequency during such gap.

BRIEF SUMMARY OF THE INVENTION

The invention therefore has among its objects, in a phase regulating circuit which is constantly synchronized by means of a displacement pick-up, to provide an arrangement which provides a compensation for any intermittent failure of the synchronizing pulses of the displacement pick-up, and which further enables the produced timing pulses to be synchronized, without disturbing the build-up processes, upon reoccurrences of the synchronizing pulses.

This objective is achieved in accordance with the present invention by the provision of a switching device which is operable, upon interruption in the displacement pick-up pulses, to interrupt the supply of output pulses from the frequency divider to the comparator, and which, upon the recurrences of the displacement pick-up pulses, reconnects the frequency divider to supply output pulses which are generally matched, with respect to their phase state, to the displacement pick-up pulses.

In a particular advantageous embodiment of the invention, the switching device comprises suitable counting and decoding means which detects a pulses of the displacement pick-up and supplies the same to a following trigger stage. An AND-gate operatively logically links the frequency divider to the comparator, and has a control input connected to the output of the trigger stage. With this arrangement the frequency divider can be of a preset type whereby it can be preset to the likely or probable phase state of the displacement pick-up pulses with respect to the output pulses of the frequency divider upon recurrence of such output pulses.

The present invention advantageously permits, in a phase regulating circuit synchronized over a displacement pick-up, in the event of an interruption in the synchronizing pulses, a compensation of the synchronizing pulses in such a manner that timing pulses, having the desired frequency, continue to be produced with the aid of the phase regulating circuit. Due to the fact that the frequency divider can be preset in accordance with the likely phase state of the displacement pick-up pulses relative to the output pulses of the frequency divider, on the recurrence of the synchronizing pulses, disturbing build-up processes which would otherwise be likely to occur, are avoided.

BRIEF DESCRIPTION OF THE DRAWINGS

In the drawings wherein like reference characters indicate like or corresponding parts:

FIG. 1 is a block circuit diagram of a known phase regulating circuit; and

FIG. 2 is a similar type of block circuit diagram of a phase regulating circuit provided with a compensating device in accordance with the present invention.

DETAILED DESCRIPTION OF THE INVENTION

Referring to the drawings, and more particularly to FIG. 1, there is illustrated a known phase regulating circuit, for example, such as described in U.S. Pat. No. 3,705,361. Such circuit comprises a phase comparator 1 the output of which is connected to the input of a voltage dependent oscillator 2 over a low pass filter comprising a resistor R1 and a capacitor C1. A frequency divider 3 feeds back the output of the oscillator 2 to one input of the phase comparator 1, the other input of which is supplied with the input timing pulses F1, the phase state of which is compared in the comparator 1 with the phase stage of the output timing pulses F3 which have been reduced in frequency by means of the frequency divider 3 to pulses F2, with the output of the comparator, in dependence thereon, modifying the voltage across the capacitor C1. Such voltage is then supplied to the oscillator 2 which, in dependence upon such voltage, correspondingly modifies the frequency of the output timing pulses F3.

If a phase regulating circuit of this type is now employed in association with a displacement pick-up, such as described in the previously referred to U.S. Pat. No. 4,019,186, in order to produce recording pulse trains in a non-mechanical printer, further circuitry, such as illustrated in FIG. 2 of the drawings is necessary.

U.S. Pat. No. 4,019,186 illustrates a displacement pick-up in the form of a light transmissive glass rod which is disposed along a row upon which the recording is to take place, and which is provided with suitable marks at specific intervals. In the process of recording such a row with the aid of a light beam, recording timing pulses are produced from a part of the light beam travelling along the light transmissive rod which is gated out. When the beam falls upon such a mark, a timing signal is produced over a suitable photo-element. The pulse train frequency so obtained possesses a relatively low value since, in dependence upon the geometry of the glass rod, the individual pulse trains can only be produced at long intervals. It is therefore necessary that the pulse train frequency obtained in this manner be multiplied and regulated. This is carried out in known manner, employing the previously described phase regulating circuit, which is supplied with the output pulses F1 obtained from the displacement pick-up and which, in dependence upon such synchronizing pulses F1, produces output timing pulses F3 having a considerable higher frequency.

However, in the utilization of a phase regulating circuit of the known type described, the production of recording timing pulses is restricted as the pulse sequences produced by the displacement pick-up possess gaps which are formed as a result of the return movement of the scanning beam from the trailing end of the glass rod to the leading end thereof. Pulse gaps of this type comprise approximately 20 percent of the overall horizontal cycle of the recording beam.

By means of the present invention, such interruption in the synchronizing pulses F1 is adequately compensated by means of the circuit arrangement illustrated in FIG. 2.

The phase regulating circuit of the present invention is preceded by a binary counter 4 which counts the synchronizing pulses F1 supplied by the displacement pick-up and, on the appearance of the last displacement pick-up pulse sets a trigger stage 5 over a decoder 6. In this set state of the trigger stage, the output thereof carries a voltage level corresponding to a logic state 0, as a result of which an AND-gate 7, which logically links the frequency divider 3/1 to the phase comparator 1, is blocked. As a result of this blockage of the AND-gate 7, no additional comparison pulse trains F2 are thereafter supplied to the comparator. At the same time, the pulses F1, supplied by the displacement pick-up, likewise are discontinued. As a result, the comparator 1 maintains the voltage constant across the capacitor C1. Thus, during the pulse pause of the displacement pick-up, the output frequency of the timing pulse is F3 is prevented from being brought in an impermissibly low value.

In order to avoid additional losses in the capacitor C1, as a result of the voltage shunt across the oscillator 2, the latter is decoupled from the capacitor C1 over an impedance transformer 8.

As a result of the above described measures, it is possible during a pulse pause in the displacement pick-up, to maintain the frequency of the out pulses F3 at a steady level. Consequently, the frequency of the output pulses F3 corresponds to the requisite frequency upon the appearance of a new pulse sequence F1 received from the displacement pick-up. The first pulse F1 of a new pulse sequence from the displacement pick-up resets the trigger stage 5 and thus again releases the phase comparator 1. If the comparator timing pulses F2 supplied by the frequency divider 3/1, were merely added, as a result of the different phase states of the comparator timing pulses F2 and the displacement pick-up pulses F1 in the comparator, disturbing build-up processes would occur which would alter the voltage value across the capacitor C1 in an uncontrolled manner and thus produce fluctuation in the output frequency F3.

This problem is avoided in the present invention by utilizing for the frequency divider 3/1, a frequency divider which can be preset, such as commercially available circuits, for example that designated SN 74193 of Texas Instruments Inc. The frequency divider 3/1, in this case, can be set over a bit pattern circuit B in accordance with the likely phase state of the displacement pick-up pulses with respect to the output pulses of the frequency divider 3/1. Such presetting value B is an empirical value which is fundamentally dependent upon the discharge of the capacitor C1 during the pulse pause in the displacement pick-up. When the first pulse arrives from the displacement pick-up, upon the resetting of the trigger stage 5, there is formed over a differentiator element 9, a so-called load pulse train 10 which is thus produced simultaneously with the opening of the AND-gate 7. Consequently, the frequency divider 3/1 will supply output pulses exhibiting a phase state corresponding to displacement pick-up pulses.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. A phase regulating circuit for producing timing pulses in conjunction with a displacement pick-up supplying synchronizing pulses for constantly synchronizing the phase regulating circuit, said circuit comprising a phase comparator having an input to which such synchronizing pulses are supplied, a voltage-dependent generator having an input operatively connected to the output of said comparator, and a frequency divider, having an input connected to receive output timing pulses from said generator, and having an output connected to another input of said phase comparator for supplying output pulses thereto, and switching means for interrupting the supply of output pulses from the frequency divider to the comparator, in the event of interruption of synchronizing pulses from such a displacement pick-up, and which upon recurrence of synchronizing pulses therefrom reestablishes the supply of pulses from the frequency divider to the comparator.

2. A circuit according to claim 1, wherein the frequency divider is of the preset type which can be preset in accordance with the likely phase state of the synchronizing pulses relative to the output pulses of the frequency divider, upon reestablishment of said synchronizing pulses.

3. A circuit according to claim 1, comprising in further combination means connected to said frequency divider for effecting a relatively close matching of the phase state of the output pulses of the frequency divider relative to that of the synchronizing pulses upon reestablishment of the supply of output pulses from the frequency divider to the comparator.

4. A circuit according to claim 1, wherein the switching means comprises a counter to which the synchronizing pulses from the displacement pick-up are supplied, the output of which is connected to a trigger stage over a decoder, and an AND-gate, to one input of which the output of the trigger stage is connected, and to another input of which the output of the frequency divider is connected, the output of the AND-gate being connected to the comparator whereby said AND-gate controls the supply of output pulses from the frequency divider to the comparator.

5. A circuit according to claim 4, wherein the output of the trigger stage is also connected to the frequency divider over a differentiating element, for synchronizing said output pulses with synchronizing pulses from the displacement pick-up.

6. A circuit according to claim 4, comprising in further combination means connected to said frequency divider for effecting a relatively close matching of the phase state of the output pulses of the frequency divider relative to that of the synchronizing pulses upon reestablishment of the supply of output pulses from the frequency divider to the comparator.

7. A circuit according to claim 6, wherein said means connected to said frequency divider includes a differentiating element which connects the output of said trigger stage to an input of said frequency divider.

8. A circuit according to claim 7, wherein the frequency divider is of the preset type which can be preset in accordance with the likely phase state of the synchronizing pulses relative to the output pulses of the frequency divider, upon reestablishment of said synchronizing pulses.

* * * * *